United States Patent [19]
Khatibzadeh et al.

[11] Patent Number: 5,105,172
[45] Date of Patent: Apr. 14, 1992

[54] MONOLITHICALLY REALIZABLE RADIO FREQUENCY BIAS CHOKE

[75] Inventors: M. Ali Khatibzadeh; Burhan Bayraktaroglu, both of Plano, Tex.

[73] Assignee: Texas Instruments Incorporated, Dallas, Tex.

[21] Appl. No.: 576,637

[22] Filed: Aug. 31, 1990

[51] Int. Cl.[5] .............................................. H03H 7/00
[52] U.S. Cl. .................................. 333/175; 333/176; 333/185
[58] Field of Search ............... 333/103, 104, 204, 262, 333/174–176, 185.184; 330/297, 202, 306, 192

[56] References Cited

U.S. PATENT DOCUMENTS

| | | | |
|---|---|---|---|
| 3,919,656 | 11/1975 | Sokal et al. | 330/306 X |
| 4,232,272 | 11/1980 | Fabri | 330/297 X |
| 4,885,796 | 12/1989 | Loftus et al. | 455/89 X |

OTHER PUBLICATIONS

Snider, David M., *A Theoretical Analysis and Experimental Confirmation of the Optimally Loaded and Overdriven RF Power Amplifier*, IEEE Transactions on Electron Devices, vol. ED-14, No. 12, Dec. 1967, pp. 851–854.

Kopp, B & Heston, D., *High-Efficiency 5-Watt Power Amplifier with Harmonic Tuning*, 1988, IEEE MTT-S Digest, pp. 839–842.

*Primary Examiner*—Eugene R. LaRoche
*Assistant Examiner*—Seung Ham
*Attorney, Agent, or Firm*—Richard A. Stoltz; Rene E. Grossman; Richard L. Donaldson

[57] ABSTRACT

A monolithically realizable radio frequency (RF) bias choke implemented as a parallel inductor/capacitor arrangement connected between a DC supply node and an RF circuit bias point.

10 Claims, 10 Drawing Sheets

MONOLITHICALLY REALIZABLE RADIO FREQUENCY BIAS CHOKE

BACKGROUND OF THE INVENTION

1. Field of the Invention

The present invention relates to RF bias isolation circuits, and, more particularly, to RF bias isolation circuits monolithically realizable on a semiconductor substrate.

2. Description of the Related Art

In the design of electronic circuits that operate at radio frequencies (RF) and above, it is necessary to provide a means for selective electrical isolation of the DC power supply node from the RF signals present in the circuit. Such means should allow DC currents to flow with little or no restriction while at the same time impeding the flow of RF currents. The traditional solution to this problem is known as a "bias tee" and is shown schematically in FIG. 1. In this approach, the DC supply voltage $V_{DC}$ is applied to node 10 and DC current $I_{DC}$ flows through inductor 20 to node 12, where it is used to bias the circuit (an active circuit is shown by way of example, but the bias could also be applied to a passive circuit, such as a PIN diode switch). The current $I_{DC}$ is prevented from flowing to node 14 by blocking capacitor 22 and from flowing to ground by bypass capacitor 24. To the RF current $I_{RF}$, the inductor 20 is a high impedance choke and the blocking capacitor 22 is a short circuit and therefore $I_{RF}$ flows freely to node 14 but is prevented from flowing to node 10.

Figure 1:
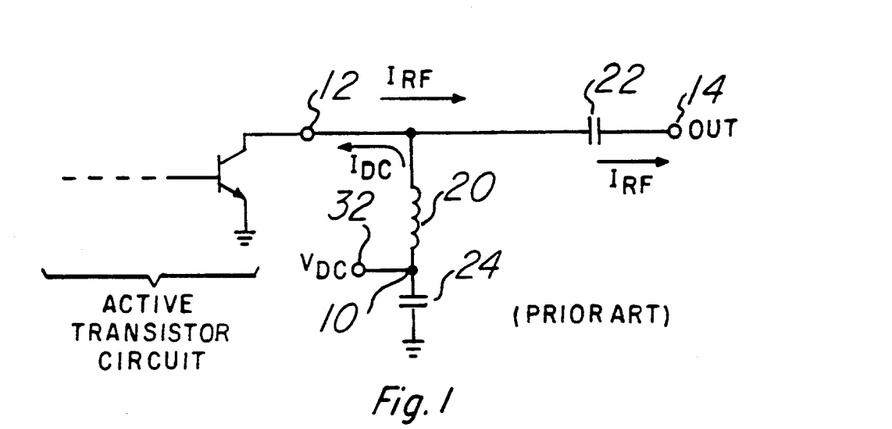
FIG. 1 is a schematic view of a prior art "bias tee" circuit.

The inductor 20 and bypass capacitor 24 form a series-resonance circuit with a resonance frequency defined by:

$$f_o = \frac{1}{2*Pi(L_{RFC}*C_{BP})^{\frac{1}{2}}}$$

In effect, this is a low-pass filter with its band-stop at the desired RF frequency. To implement such a circuit with $f_o$ in the UHF band (for example, 815–925 MHz, as required in cellular telephone communications) would require:

$L_{RFC} > 30$ nH $C_{BP} > 1000$ pF

The high value of $L_{RFC}$ required would make it impossible to implement the circuit of FIG. 1 in a low-cost, manufacturable monolithic integrated circuit. Inductance values greater than 10 nH are very difficult to obtain due to the large area required by the inductor, its current handling capability and excessive losses. For such inductors, traditionally, wound coils or printed circuit spirals coated with ferrite materials have been used. Both such solutions are obviously incompatible with integrated circuit technology.

Figure 2:
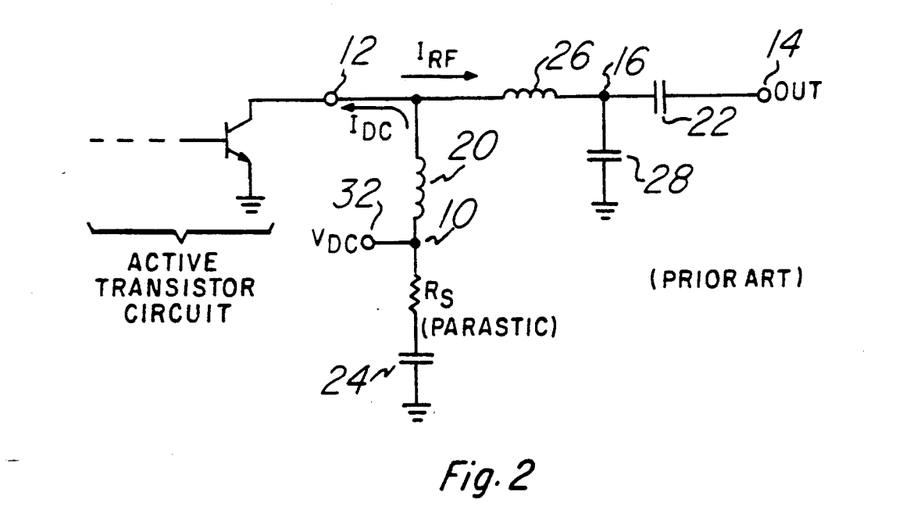
FIG. 2 is a schematic view of a prior art variation of the circuit of FIG. 1, using the choke inductor as part of the output matching circuit.

Another alternative, illustrated schematically as FIG. 2, is to use a smaller value of inductance $L_{RFC}$ and incorporate inductor 20 as part of the RF output matching circuit, since the smaller value of $L_{RFC}$ will no longer be "invisible" to the RF signal.

The problem with this approach is that the RF operating frequency band of the host circuit is closer to the resonant frequency of the inductor 20/capacitor 24 choke. At these frequencies, the choke is no longer seen as a high impedance by the RF current, but instead appears inductive. The Q-factor of this shunt inductor 20/capacitor 24 choke is:

$$Q = \left| \frac{wL_{RFC}}{R_s} - \frac{1}{wC_{BP}R_s} \right|$$

where:
$R_s$ = series resistance of inductor 20 and capacitor 24
$w$ = RF frequency in radians Therefore, decreasing the value of $L_{RFC}$ lowers the Q-factor of the shunt inductor 20/capacitor 24 choke. Because the Q of the external bypass capacitor 24 is normally low, substantial loss in the RF signal occurs due to the relatively large RF current that flows in the inductor 20/capacitor 24 path.

Figure 3:
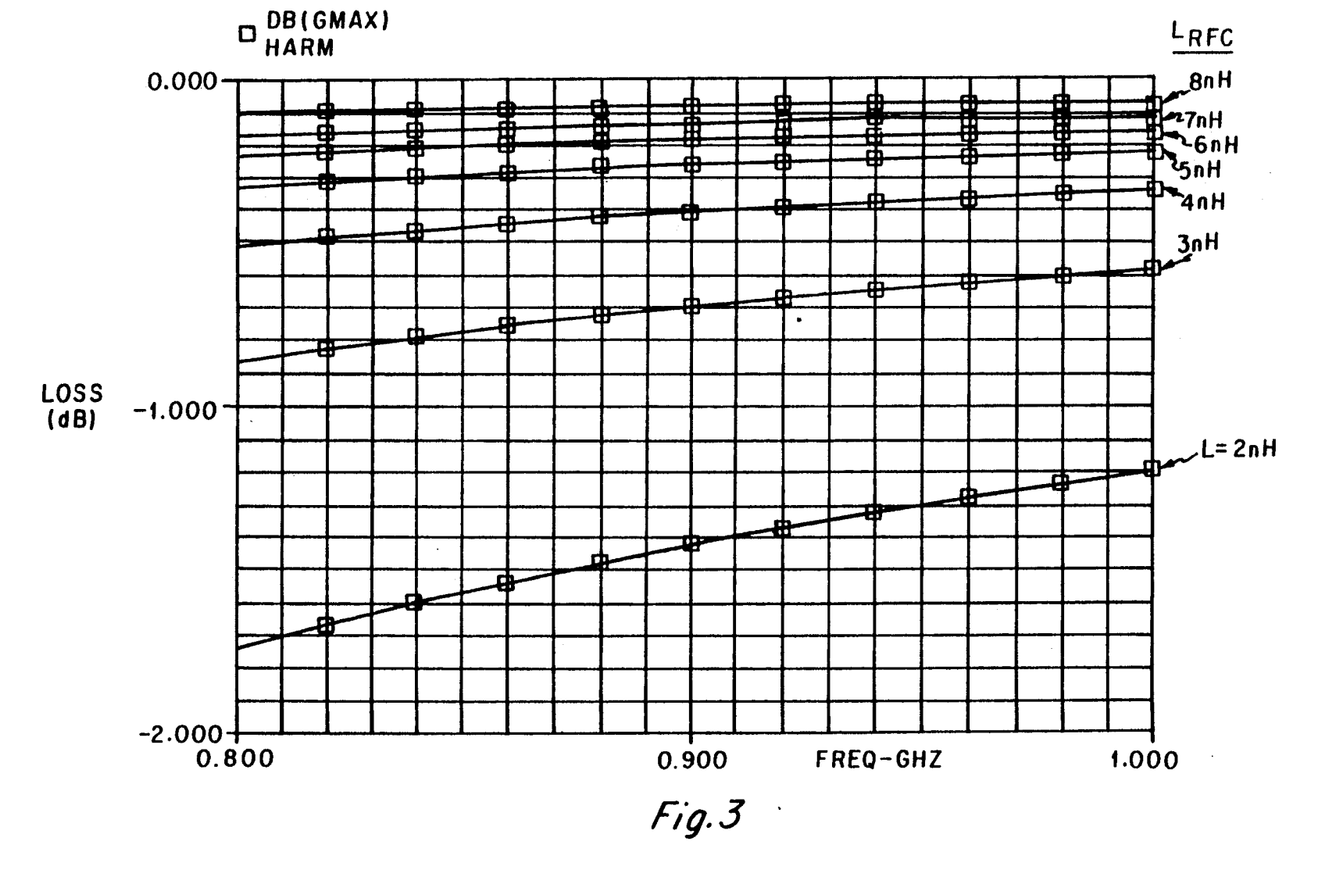
FIG. 3 is a plot of RF signal loss versus frequency (with $L_{RFC}$ varied parametrically) of the circuit of FIG. 2.

FIG. 3 shows a computer analysis (using EEsof Touchstone analysis software) of the RF signal loss of the circuit in FIG. 2 assuming the following values (which correspond to a RF band of 800–1000 MHz):

$C_{BP} = 10660$ pF
$R_s = 1$ Ohm
$L_M = 5.5$ nH
$C_M = 5.0$ pF
$C_B = 24$ pF
$L_{RFC}$ = varied parametrically as shown in FIG. 3.

It is readily apparent that the RF signal loss is directly proportional to the inductance $L_{RFC}$. A loss of less than 0.1 dB (required in a high efficiency amplifier, for example) requires an inductance $L_{RFC}$ of greater than 9 nH. Therefore the circuit configuration of FIG. 2 requires inductance values which are not compatible with monolithic integration. It also makes the RF signal loss very sensitive to the Q-factor of the external bypass capacitor 24 which is not desirable.

Therefore, the need exists for a RF bias choke that is implementable in a monolithic form and which will cause minimum loss to the RF signal (i.e. high efficiency).

SUMMARY OF THE INVENTION

The present invention provides a monolithically realizable circuit implementation of a RF bias choke which eliminates the need for external (off-chip) inductors in narrow-band RF analog integrated circuits.

In a preferred embodiment, the monolithic RF bias choke is implemented as a parallel inductor/capacitor arrangement connected between the DC supply node and the RF circuit bias point. Inductance and capacitance values are chosen such that the circuit will pass DC currents while blocking RF currents in the host circuit's operating frequency band.

This circuit solves the problem of known bias isolation circuits by allowing a relatively small value of inductance to be used, enabling monolithic integration of the isolation circuit on the same chip as the host circuit. This eliminates the need for off-chip (discrete) bias components.

DESCRIPTION OF THE PREFERRED EMBODIMENTS

Figure 4:
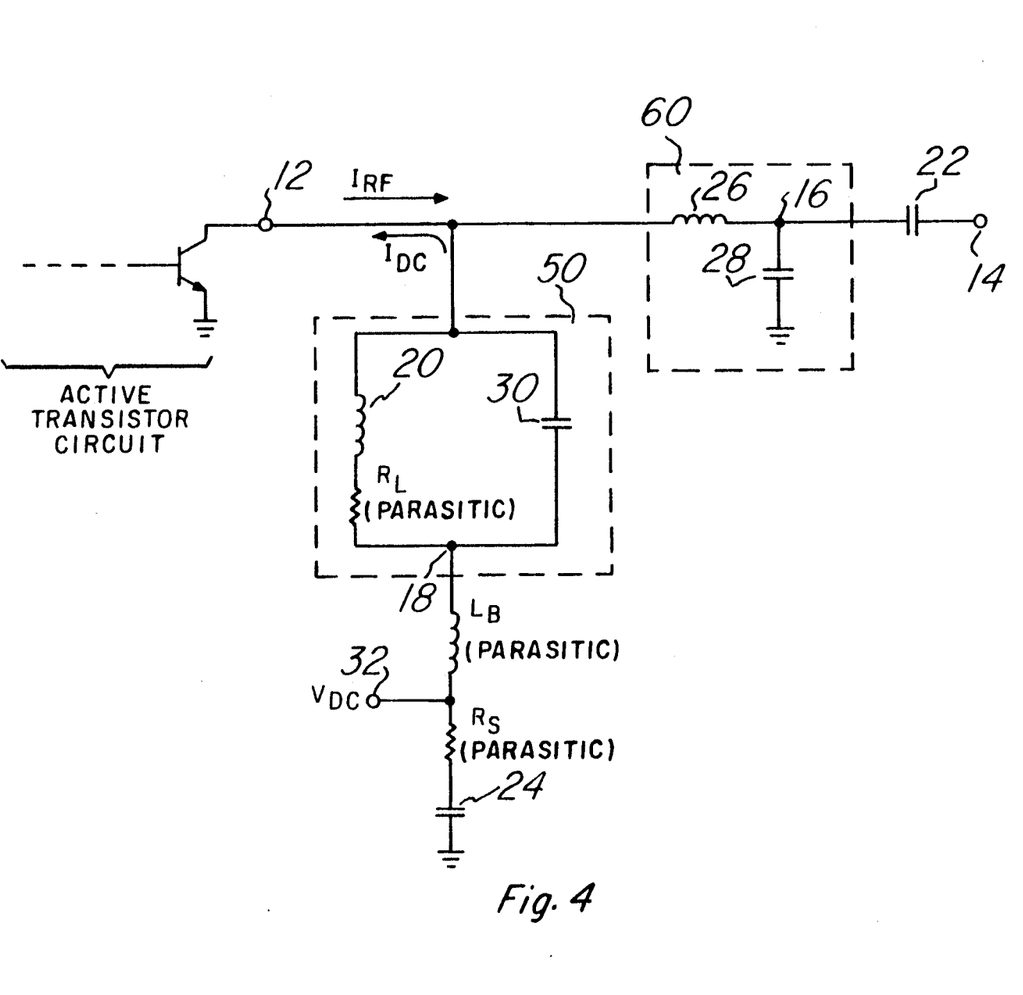
FIG. 4 is a schematic view of the monolithically realizable RF choke incorporated into a host circuit.

A first preferred embodiment circuit for a monolithically realizable RF choke is shown in FIG. 4, incorporated into a host circuit (an active host circuit is shown by way of example, but the RF choke could readily be incorporated into a passive circuit, such as a PIN diode switch).

The host circuit contains a terminal 12 for receiving DC bias current and for outputting RF signal current, to which is connected one side of an inductor 26, the other side of which is connected to a node 16. A capacitor 28 is connected between node 16 and ground. Inductor 26 and capacitor 28 together form an output matching network 60 of the host circuit. A blocking capacitor 22 is connected between node 16 and a circuit output terminal 14. An inductor 20 is connected between terminal 12 and a node 18. A capacitor 30 is also connected between terminal 12 and node 18, in parallel with inductor 20. Inductor 20 and capacitor 30 together make up a monolithically realizable RF choke 50. The parasitic series resistance of inductor 20 is represented as $R_L$. An input terminal 32 for receiving an external DC bias voltage is provided and is directly connected to a node 10. Node 10 is in turn directly connected to node 18 via a bondwire. The parasitic inductance of the bondwire is represented as $L_B$. A bypass capacitor 24 is connected between node 10 and ground. The parasitic series resistance of capacitor 24 is represented as $R_s$.

In operation, a DC voltage is applied to terminal 32 which causes a DC current $I_{DC}$ to flow through inductor 20 to the host circuit terminal 12. The current is prevented from flowing in any other branch of the circuit by capacitors 22, 24, 28 and 30, all of which appear as open circuits to the DC current. At the same time, $I_{RF}$ current $I_{RF}$ is flowing out of terminal 12 (in the direction of the arrow) through the series-shunt matching circuit 60 and then through blocking capacitor 22 to output terminal 14. $I_{RF}$ is prevented from flowing into RF choke 50 because the choke's resonant frequency, $f_o$, is designed to be equal to the host circuit's operating frequency, f, by using the following relationship:

$$f_o = \frac{1}{2 \cdot Pi(L_{RFC} \cdot C_{RFC})^{\frac{1}{2}}} = f$$

At the resonant frequency, the RF choke 50 is an open circuit, hence no RF current flows into it. At the same time, however, it remains a short circuit to the DC bias current $I_{DC}$ (through inductor 20). This substantially reduces the loss due to the external bypass capacitor 24 series resistance, as very little RF current will flow to ground through bypass capacitor 24. This also makes the host circuit's performance insensitive to load impedance at node 18.

Figure 5:
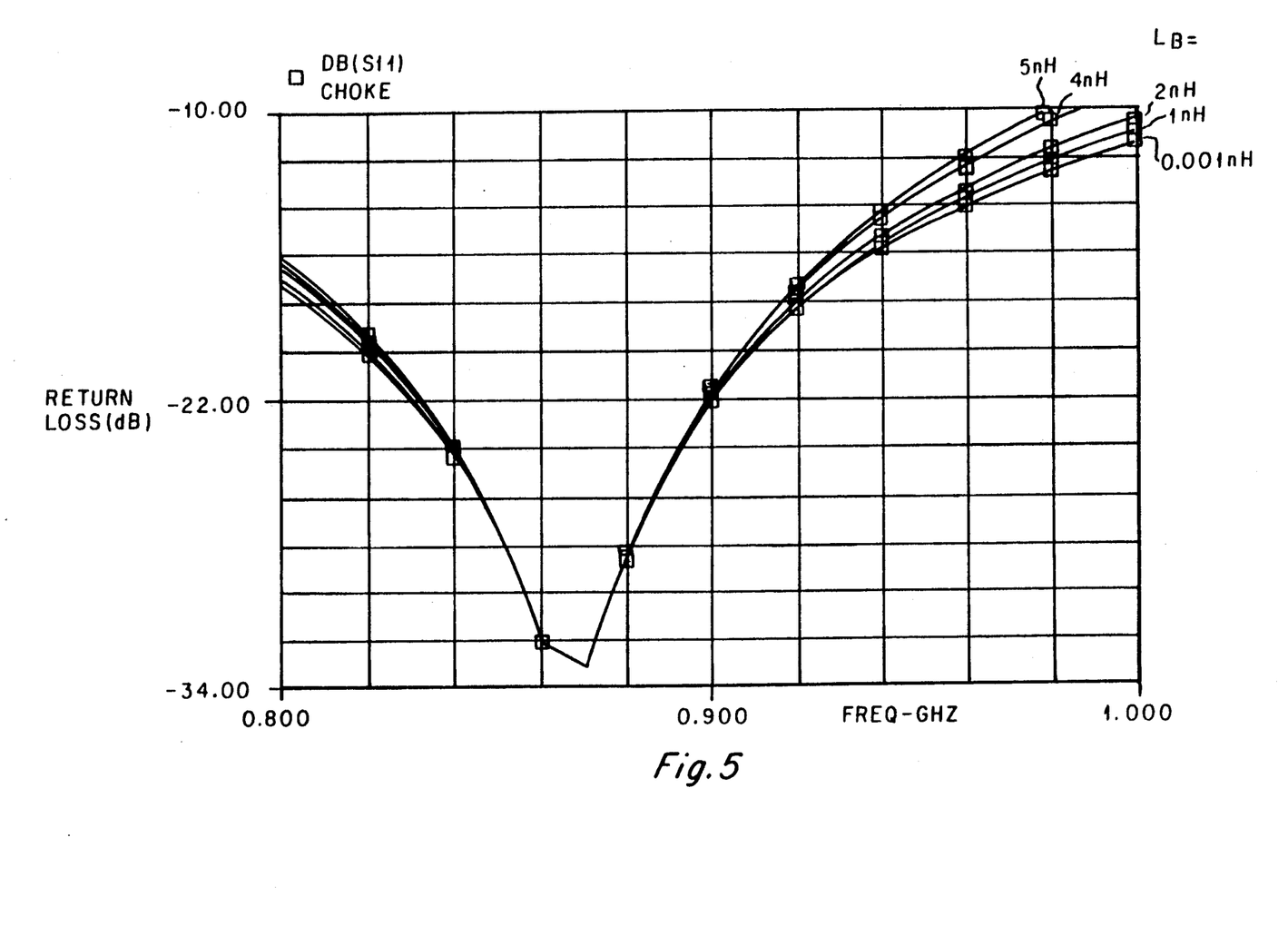
FIG. 5 is a plot of the RF signal return loss versus frequency (with $L_B$ varied parametrically) of the circuit of FIG. 4.

FIG. 5 shows the calculated RF signal return loss from the shunt monolithically realizable RF choke of FIG. 4 when designed to operate in the 815–925 MHz band with:

$f_o = 870$ MHz
$L_{RFC} = 4.5$ nH
$R_L = 0.5$ Ohm
$C_{RFC} = 7.5$ pF
$R_s = 1$ Ohm
$C_{BP} = 1000$ pF

As shown in the figure, the reflections are very small (better than $-20$ dB) in the 815–925 MHz band. In other words, to the RF signal, the choke is invisible. Also shown (parametrically) in FIG. 5 is the variation of the reflection to changes in load impedance at node 18. This is done by changing the bondwire inductance $L_B$ from 0.001 nH to 5 nH with little effect on the return loss.

Figure 6:
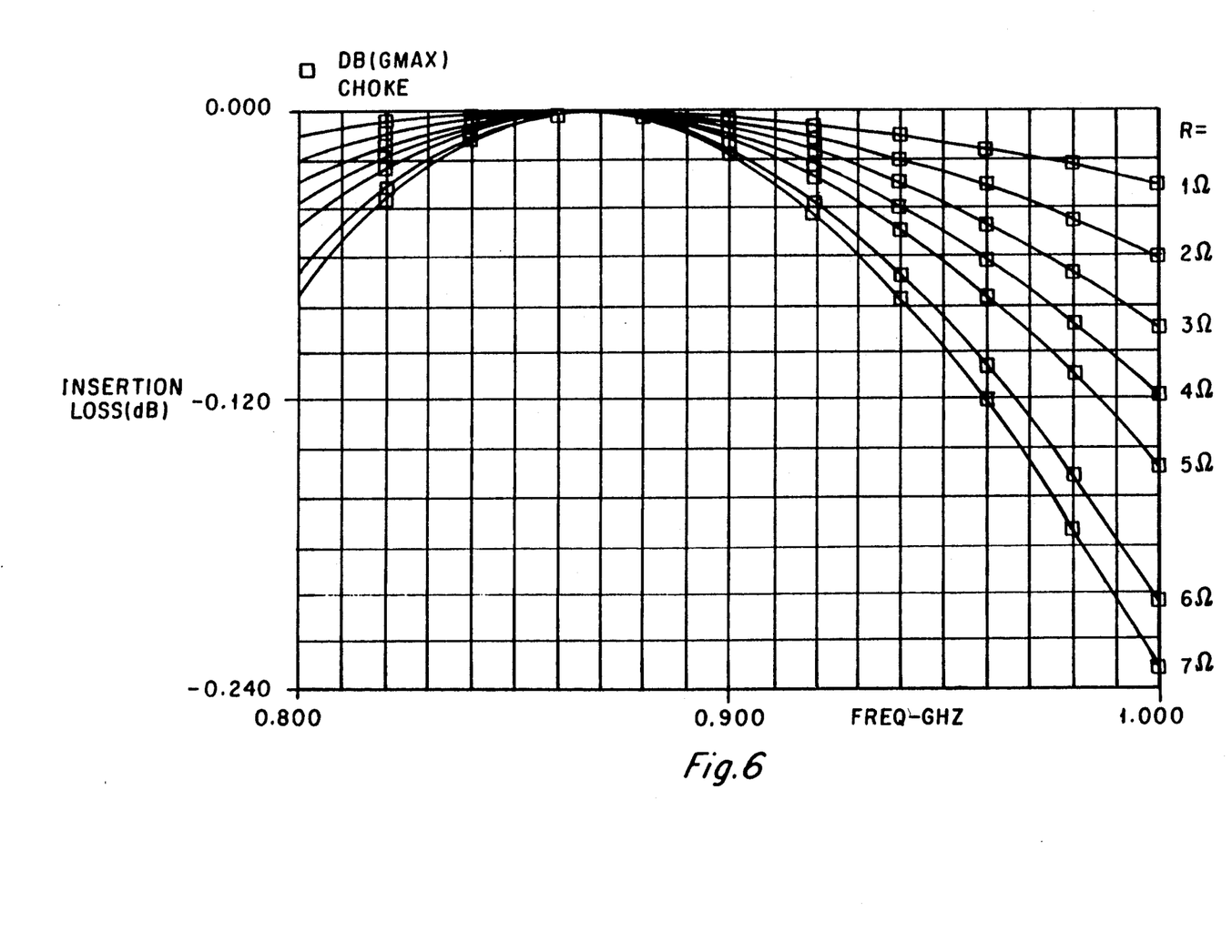
FIG. 6 is a plot of signal insertion loss versus frequency (with $R_s$ varied parametrically) of the circuit of FIG. 4.

FIG. 6 shows the calculated variation of the RF signal insertion loss of the RF choke 50 due to the series resistance $R_s$ of the external bypass capacitor 24. This is done by varying the series resistance from 1 Ohm to 7 Ohms in 1 Ohm steps, and using the following component values:

$f_o = 870$ MHz
$L_{RFC} = 4.5$ nH
$R_L = 0$ Ohm
$C_{RFC} = 7.5$ pF
$L_B = 0.01$ nH
$C_{BP} = 1000$ pF

The results indicate a loss of nearly 0 dB at resonance ($f_o = f$) and it is fairly insensitive to the loss of the external bypass capacitor 24 ($R_s$).

Figure 7:
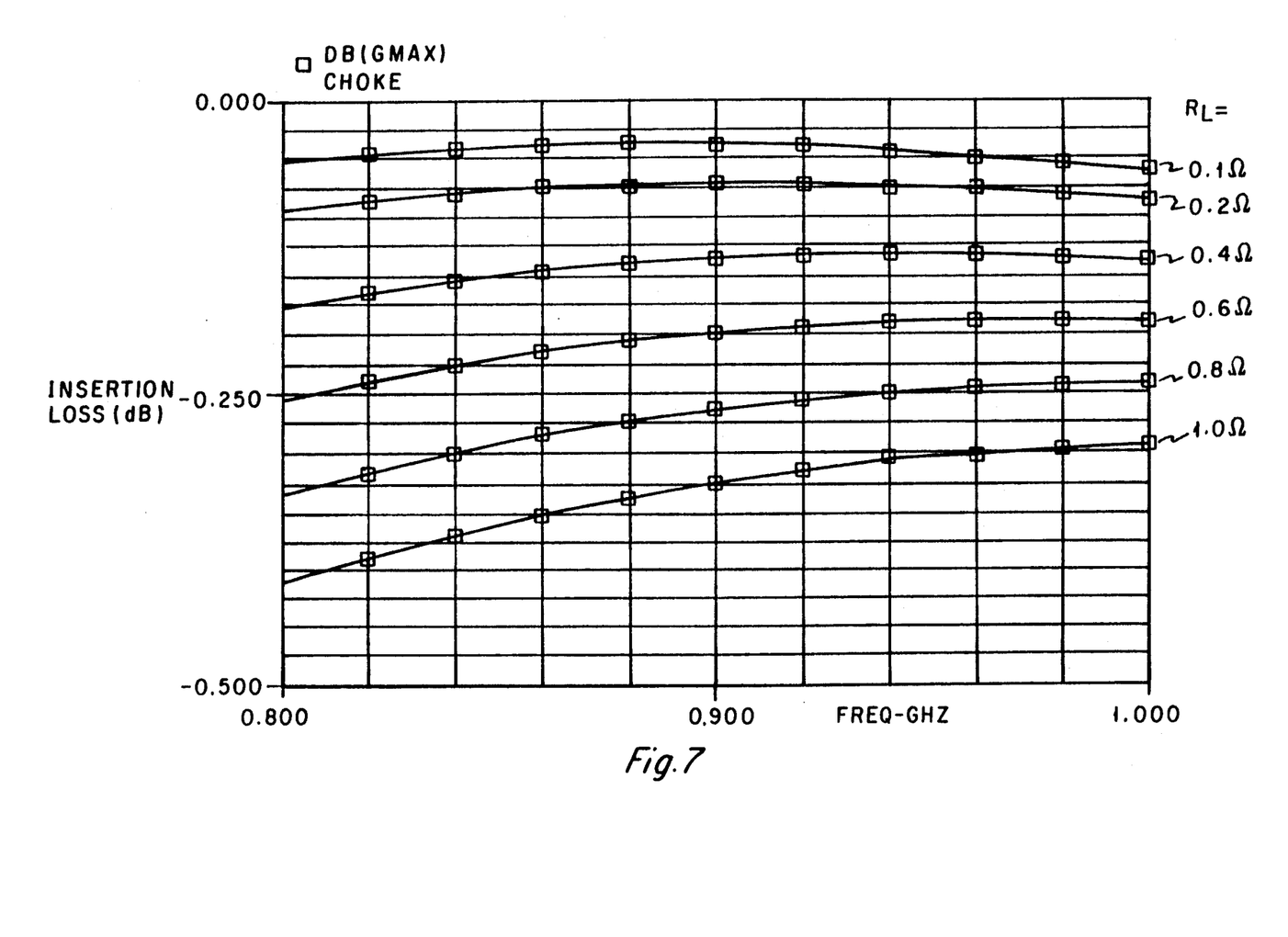
FIG. 7 is a plot of RF signal insertion loss versus frequency (with $R_L$ varied parametrically) of the circuit of FIG. 4.

FIG. 7 shows the calculated effect on the RF signal insertion loss of parasitic series resistance in inductor 20, $R_L$, using the following component values:

$f_o = 870$ MHz
$L_{RFC} = 4.5$ nH
$C_{RFC} = 7.5$ pF
$R_s = 1$ Ohm
$C_{BP} = 1000$ pF

The inductor parasitic resistance $R_L$ is varied from 0.1 Ohm to 1 Ohm. It is seen that for a realistic value of 0.55 Ohms for a monolithic inductor, losses can be minimized to less than 0.25 dB.

Figure 8:
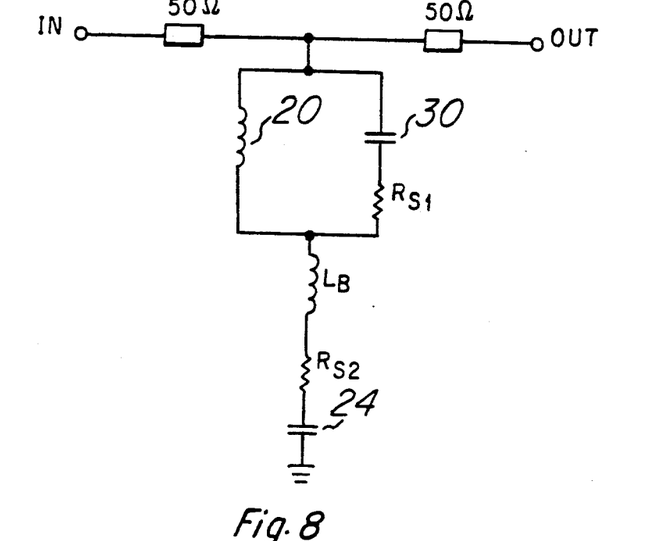
FIG. 8 is a schematic view of a test circuit used to make experimental measurements of the monolithically realizable RF bias choke.

Experimental measurements of the monolithically realizable RF bias choke were made on the hybrid test circuit of FIG. 8. Inductances $L_{RFC}$ and $L_B$ were realized with 200 mil lengths of 1 mil diameter bond wire. Capacitances $C_{RFC}$ and $C_{BP}$ were realized with parallel plate chip capacitors mounted with silver epoxy to 50 Ohm microstrip transmission lines on 10 mil alumina substrate. This combination yields a resonant frequency of 905 MHz.

Figure 9:
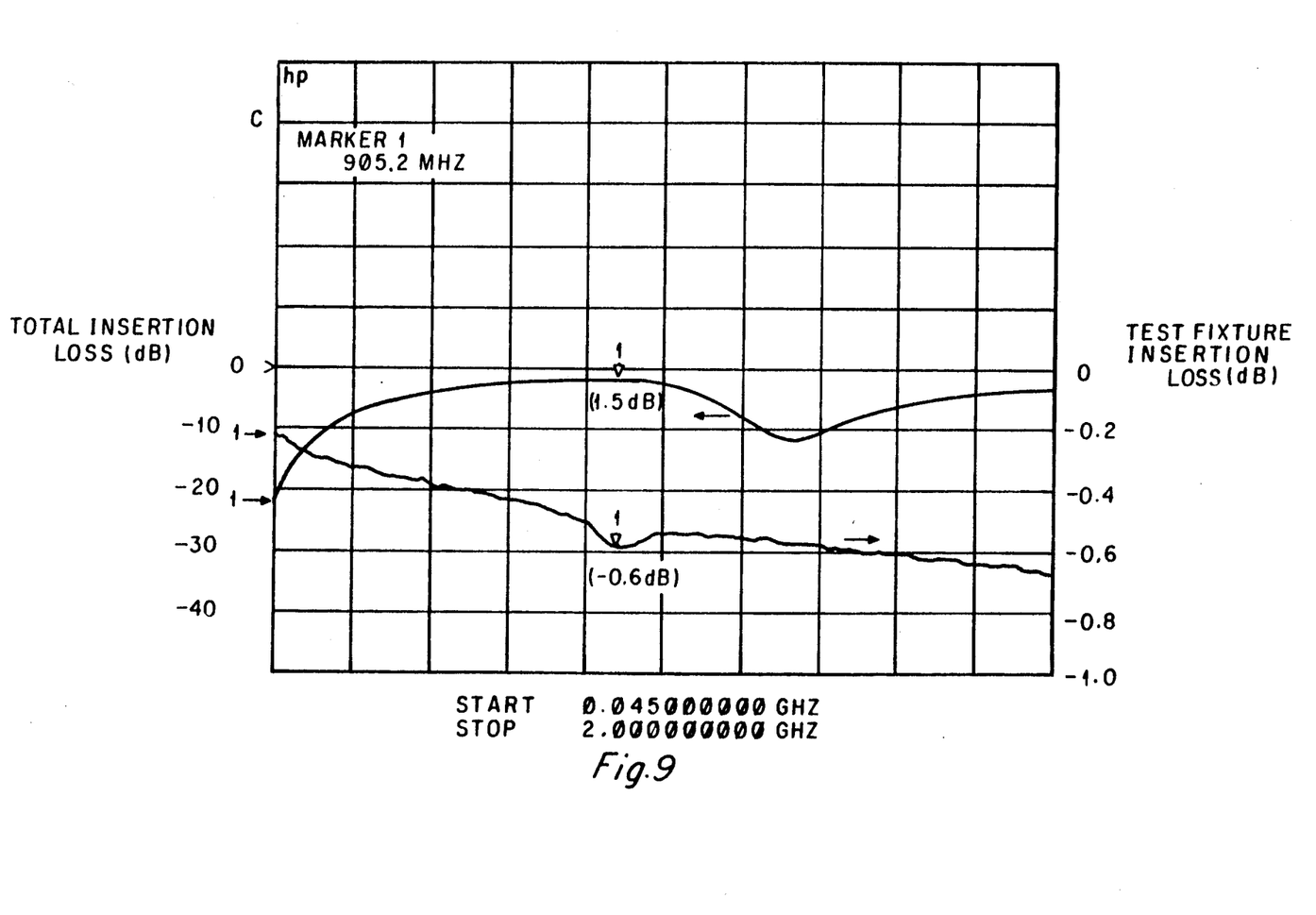
FIG. 9 is a plot of the RF signal return loss versus frequency of the circuit of FIG. 8.

FIG. 9 shows the measured return loss of the circuit in FIG. 8 taken from 45-2000 MHz. The return loss at resonance (905 MHz) is 26 dB and is better than 18 dB across the entire 825-915 MHz cellular communications band. Thus the proper operation of the choke is verified, i.e. the RF energy in the desired band is isolated from the external bypass capacitor 24.

Figure 10:
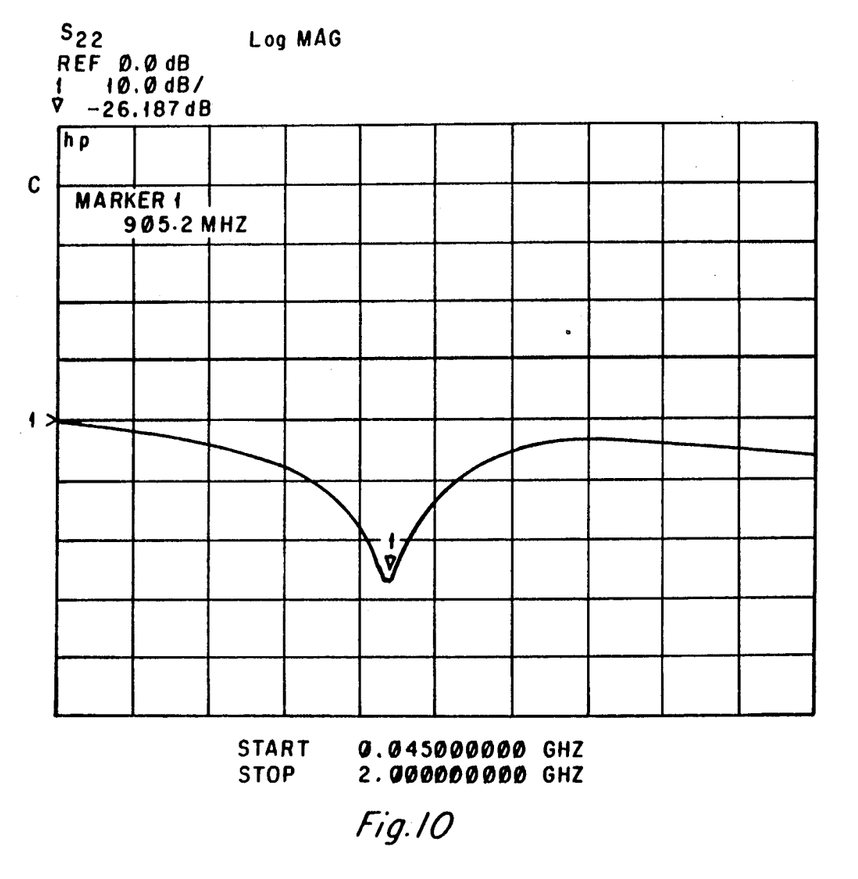
FIG. 10 is a plot of the RF signal insertion loss versus frequency of 1) the circuit of FIGS. 8 and 2) the test fixture of FIG. 8 alone.

The measured insertion loss of the circuit in FIG. 8 is plotted from 45-2000 MHz in FIG. 10. The upper trace, corresponding to the left hand vertical axis, shows the insertion loss of both the RF bias choke and the test fixture. The loss of the test fixture alone (with the RF bias choke disconnected from the circuit) is shown in the bottom trace, which corresponds to the right hand vertical axis. The algebraic difference of these two plots gives the insertion loss of the choke without any effect from the test fixture. At the resonant frequency of 905 MHz, the insertion loss is measured at 0.9 dB. This loss is mainly due to the parasitic series resistance of the capacitance $C_{RFC}$ and possibly some resistance associated with the silver epoxy used to mount the capacitor.

Performance of the monolithic implementation of the test circuit of FIG. 8 would yield a much smaller value of insertion loss due to the lower parasitic series resistance of the monolithic MIM (Metal-Insulator-Metal) capacitors and the absence of the silver epoxy mount.

Figure 11:
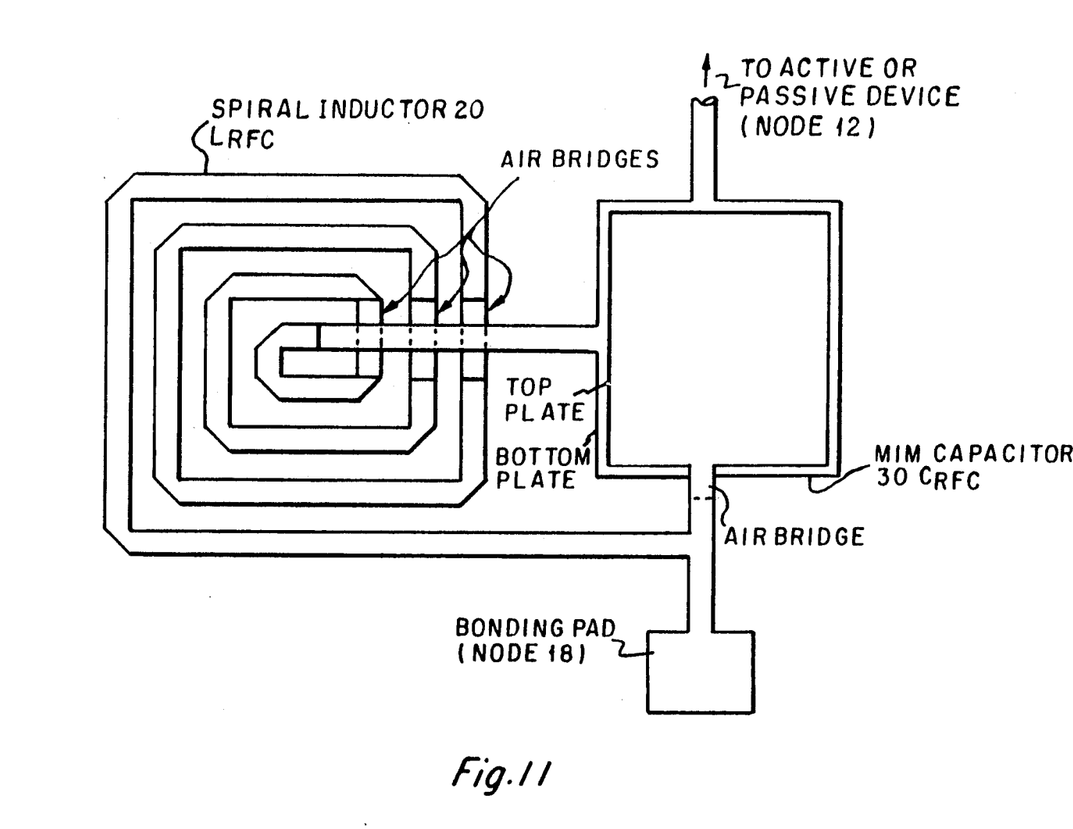
FIG. 11 is a plan view of a monolithic implementation of the RF bias choke 50 of FIG. 4.

All of the above results were obtained with $L_{RFC}$ and $C_{RFC}$ values that are easily realizable in monolithic form. FIG. 11 illustrates a possible configuration of the RF bias choke 50 of FIG. 4 in monolithic form on a suitable substrate such as GaAs. The inductor 20 is implemented as a spiral inductor patterned onto the semiconductor substrate by conventional processing methods, while capacitor 30 is implemented as a MIM capacitor.

MODIFICATIONS AND ADVANTAGES

Various modifications of the preferred embodiment may be made while retaining the basic features of the monolithically realizable RF bias choke.

For example, a first modification may be made by substituting a high resistivity ($>10^3$ Ohm-cm) Si substrate for the GaAs substrate of FIG. 11.

Figure 12:
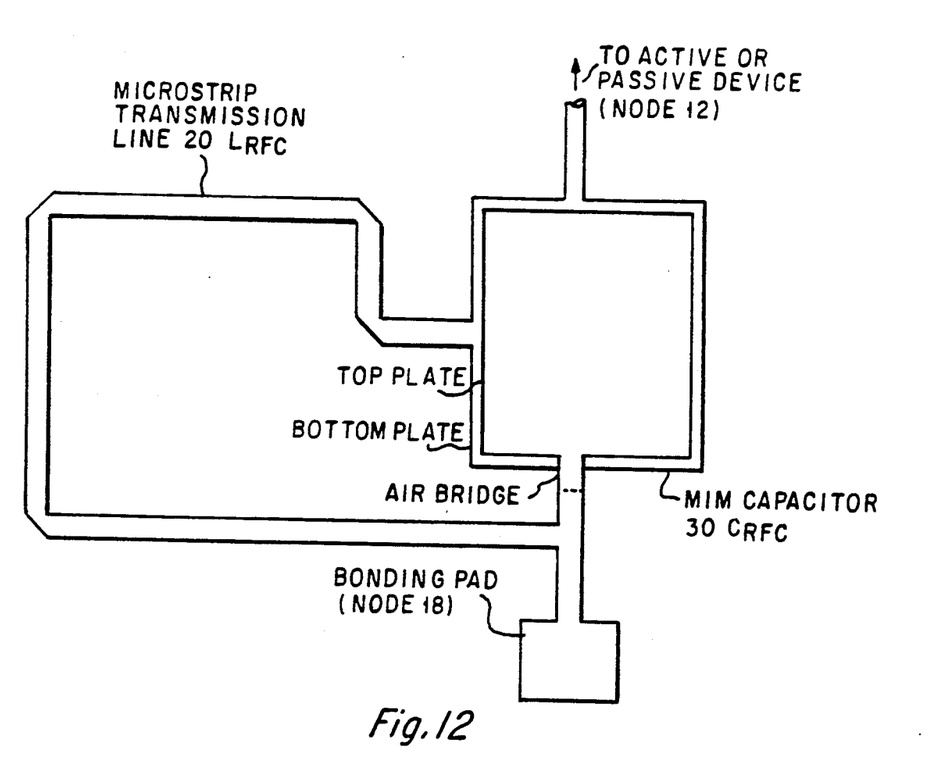
FIG. 12 is a plan view of a monolithic implementation of the RF bias choke 50 of FIG. 4.

In a second modification, the spiral inductor 20 of the monolithic circuit of FIG. 11 may be realized instead by a section of microstrip or stripline transmission line, as shown in FIG. 12.

Advantages of the first preferred embodiment include its simplicity, its relatively small inductance value requirement and its ability to be implemented as part of a MMIC, thereby minimizing the number of discrete, off-chip components required (which offers cost, space and reliability advantages). In a third modification, the spiral inductor 20 and MIM capacitor 30 of FIG. 11 and/or the transmission line 20 of FIG. 12 may be realized instead on a semiconductor layer formed upon the substrate or upon another semiconductor layer.

What is claimed is:

1. A monolithically realizable radio frequency (RF) bias choke, comprising:
   an input terminal for receiving a DC bias current;
   an output terminal for transmitting said DC bias current to the conduction path of an RF signal;
   inductive means connected between said input terminal and said output terminal for the conduction of DC current therebetween, wherein said inductive means are formed upon a first semiconductor surface;
   capacitive means connected between said input terminal and said output terminal, wherein said capacitive means are formed upon a second semiconductor surface and said capacitive means are connected in parallel with said inductive means for forming a parallel resonant circuit; and
   an inductance of said inductive means and a capacitance of said capacitive means being of predetermined magnitudes to cause the parallel connection of said inductive means and said capacitive means to have a resonant frequency which is equal to the frequency of said RF signal, thereby preventing transmission of said RF signal between said output terminal and said input terminal.

2. The monolithically realizable RF bias choke of claim 1, wherein:
   said first semiconductor surface is a surface of a semiconductor substrate; and
   said second semiconductor surface is a surface of said semiconductor substrate.

3. The monolithically realizable RF bias choke of claim 1, wherein:
   said first semiconductor surface is GaAs; and
   said second semiconductor surface is GaAs.

4. The monolithically realizable RF bias choke of claim 1, wherein said inductive means is a planar spiral inductor.

5. The monolithically realizable RF bias choke of claim 1, wherein:
   said RF signal frequency varies with time, said frequency limited to a finite frequency band; and
   said resonant frequency is within said finite frequency band.

6. The monolithically realizable RF bias choke of claim 5, wherein said resonant frequency is at the center of said finite frequency band.

7. The monolithically realizable RF bias choke of claim 1, wherein:
   said first semiconductor surface is a surface of a semiconductor substrate; and
   said second semiconductor surface is a surface of a semiconductor layer formed above said semiconductor substrate.

8. The monolithically realizable RF bias choke of claim 1, wherein:
   said first semiconductor surface is a surface of a semiconductor layer formed above a semiconductor substrate; and
   said second semiconductor surface is a surface of said semiconductor substrate.

9. The monolithically realizable RF bias choke of claim 1, wherein:
   said first semiconductor surface is a surface of a semiconductor layer formed above a semiconductor substrate; and
   said second semiconductor surface is a surface of said semiconductor layer.

10. The monolithically realizable RF bias choke of claim 1, wherein:
    said first semiconductor surface is a surface of a first semiconductor layer formed above a semiconductor substrate; and
    said second semiconductor surface is a surface of a second semiconductor layer formed above said substrate.

* * * * *